United States Patent

[11] 3,617,778

[72] Inventor Arpad Korom
Zurich, Switzerland

[21] Appl. No. 832,287
[22] Filed June 11, 1969
[45] Patented Nov. 2, 1971
[73] Assignee Gesellschaft Zur Forderung Der Forschung An Der Eidg Techn Hochschule
Zurich, Switzerland
[32] Priority July 6, 1968
[33] Switzerland
[31] 10174/68

[54] ELECTRONIC CIRCUIT ARRANGEMENT WITH AT LEAST ONE INTEGRATED ELECTRONIC CIRCUIT UTILIZING CONSTANT CURRENT SOURCES IN CONNECTION WITH GALVANIC COUPLING BETWEEN TRANSISTOR STAGES COUPLED WITH EACH OTHER IN LIEU OF HIGH OHMIC RESISTORS

32 Claims, 12 Drawing Figs.

[52] U.S. Cl. 307/303, 307/310, 307/313, 307/225, 307/288, 307/292, 307/213
[51] Int. Cl. H03k 23/08
[50] Field of Search 307/213, 225, 288, 292, 303, 310

[56] References Cited

UNITED STATES PATENTS

| | | | |
|---|---|---|---|
| 3,518,449 | 6/1970 | Chung | 307/213 X |
| 3,522,446 | 8/1970 | Kodama | 307/303 X |

*Primary Examiner*—John S. Heyman
*Attorney*—Pierce, Scheffler & Parker

ABSTRACT: Integrated circuit arrangement, wherein the difficulties of building up high ohmic resistors with good properties within integrated circuits have been removed by means of replacing the high ohmic collector resistors and the high ohmic base biasing resistors of conventional integrated circuits by constant current sources in connection with galvanic coupling between transistor stages following one another. The mean collector current and the mean base biasing current of galvanically coupled transistors following one another are delivered by one constant current source. The alternating collector current superposed to this means collector current flows directly and completely into the base-emitter circuit of the galvanic coupled following transistor.

INVENTOR.
Arpad Korom
BY
Pierce Scheffler & Parker
Attorneys

INVENTOR.
Arpad Korom
BY
Pierce, Scheffler & Parker
Attorneys

INVENTOR.
Arpad Korom
BY
Prince, Schiffler & Parker
Attorneys

INVENTOR.
Arpad Korom
BY
Pierce, Scheffler & Parker
Attorneys

INVENTOR.
Arpad Korom
BY
Pierce, Scheffler & Parker
Attorneys

INVENTOR.
Arpad Korom

BY
Pierce, Scheffler & Parker
Attorneys

ELECTRONIC CIRCUIT ARRANGEMENT WITH AT LEAST ONE INTEGRATED ELECTRONIC CIRCUIT UTILIZING CONSTANT CURRENT SOURCES IN CONNECTION WITH GALVANIC COUPLING BETWEEN TRANSISTOR STAGES COUPLED WITH EACH OTHER IN LIEU OF HIGH OHMIC RESISTORS

The invention relates to an electronic circuit arrangement comprising one or more integrated switching circuits and having a plurality of controlled transistors of the same conduction type, of which the collector currents can be altered by control signals in their base-emitter circuits and to the collectors of which are galvanically coupled the connected load resistances or those base-emitter circuits of the connected and controlled transistors which form said resistances.

Circuit arrangements of this type are generally known in the art concerned with integrated switching circuits.

For subminiature purposes, that is to say, for the construction of such circuit arrangements in a smallest possible space, the volume necessary for the current supply source of the circuit arrangement should be as small as possible, because when using the integrated circuit technique, usually the current supply source occupies the major part of the total volume taken up by the circuit arrangement and current supply source.

Arising from the condition of a smallest possible volume of the current supply source, it is laid down that, since the volume of a battery is in first approximation proportional to the amount of energy stored by the battery, one should manage for operating the circuit arrangement with a battery of which the stored quantity of energy is as small as at all possible. It is true that the energy $E=U\cdot I\cdot T$ stored in the battery and thus the volume of the current supply source could be greatly reduced in arbitrary manner if simultaneously a corresponding shortening of the operating period $T$ were to be accepted. Usually, however, conditions are established for the operating life of the battery forming the current supply source of a circuit arrangement until the exhaustion thereof, so that a shortening of the operating life for the purpose of reducing the volume of the current supply source is not to be considered in most cases. In all these cases, a reduction in the volume occupied by the current supply source can only be produced by the power $N=U\cdot I$ required by the electronic circuit being kept as low as possible. Accordingly, the operating voltage required by the electronic circuit and also the operating current required by the electronic circuit are to be kept as low as possible. A possibility of reducing the volume of the current supply source by lowering the operating voltage of the electronic circuit arrangement is limited in the case where the battery serving as current supply source consists only of a single cell. The possibility of producing a reduction in the volume of the current supply source by lowering the operating current of the electronic circuit arrangement is limited by the fact that the upper limit frequency at which the integrated switching circuits are still capable of functioning is always further reduced by the parasitic capacitances inside integrated switching circuits or inside the switch elements incorporated into the integrated switching circuits and between the same, with the reduction of the working current. This is because the charging up of such parasitic capacitances takes a longer time in proportion as the charging current is lower and the charging currents in their turn are again dependent on the working current. Therefore, if an upper operating frequency is required for the integrated switching circuits, then it is laid down that the working current of the electronic switching arrangement, considered generally, cannot fall below a certain lower limiting value. The currents needed at least per stage of the integrated switching circuit are, for example, in the order of size of a few microamperes for an upper operating frequency of 100 kc./s.

Occasionally, from the requirement of having a smallest possible volume of the current supply source is firstly that a single cell is to be used as current supply source, the original voltage of said cell, depending on its type, being in the range between 1.2 and 1.5 volts, while secondly there is to be calculated a current per stage of the integrated switching circuit or circuits which is in the order of microamperes.

From these two values, i.e. a working voltage of 1.2 to 1.5 volts and working currents per stage in the order of magnitude of microamperes, it again follows that the resistances through which separate controlled transistors in the integrated switching circuits are fed with their collector current and also with the base current of the next following controlled transistor galvanically coupled to its base-emitter circuit, must have resistance values in the range from a few hundreds of kilohms up to several megohms.

The manufacture of such high resistances in the integrated switching circuit art now involves considerable difficulties or a relatively high technical expenditure.

In principle, there are two ways of producing such high resistances in the integrated circuit art.

One way consists in producing resistance paths in the carrier crystal by diffusion, simultaneously with the diffusion of the transistors and diodes into the carrier crystal of the integrated switching circuit which is to be produced. Two variants of this procedure exist, namely, firstly the production of so-called diffused resistances, with which one or more channels are formed by diffusion in the carrier crystal simultaneously with the diffusion of the base electrodes of the transistors and diodes, said passages then forming the resistance paths with their full cross section, and secondly the production of so-called pinch resistors, with which, in the same way as with the production of the diffused resistances, one or more passages are formed by diffusion in the carrier crystal, but the conducting cross section of said passages is further reduced by another diffusion taking place simultaneously with the diffusion of the emitter electrodes of the transistors and diodes, so that then only that residual part of the conduction cross section of the said passage or passages which is not taken up by the said further diffusion forms the resistance paths.

The other way or method consists in a thin layer of resistance material being applied by vapor-coating after completing the diffusion of the transistors and diodes on to the support crystal, whereupon a part of this layer is removed by etching, the part which remains forming the required resistance path or paths. In addition, a second vapor-coating method also exists, with which the required resistance paths are vapor-coated through the openings of an applied mask, but this procedure is substantially less accurate and more costly than the first-mentioned vapor-coating procedure.

As already mentioned above, both methods involve difficulties or an increased technical expenditure for the production of the high resistances, and in addition the resistances which are produced sometimes have quite disadvantageous properties.

With the said one method, the first variant is unsuitable for the production of resistances in the order of magnitude from some hundreds of kiloohms up to some megohms, because with this variant, the specific surface resistances are restricted to a maximum of about 300 ohms per square. Now since the width of the resistance paths must for manufacturing reasons amount to at least 25 $\mu$, only 300 ohms are obtained per 25 $\mu$ of length of the resistance path, i.e. only 12 kilohms per millimeter of length.

In order to be able by this method to produce a resistance of for example 500 kilohms the resistance path would have to have a length of about 40 mm. Since the carrier crystals of the integrated switching circuits are usually not larger than about 2×2 mm., this resistance path with a length of 40 mm. will have to be applied in the form of a meandering line with 20 parallel path sections each of a length of 2 mm. on the carrier crystal, and since for manufacturing reasons a spacing of at least 25 $\mu$ must also be left between the separate path sections, the resistance would occupy an area of 2 mm. in one direction and 20 × (25 $\mu$ path width plus 25 $\mu$ spacing) = 1 mm. in the other direction, and accordingly would occupy half of the total area of the carrier crystal. When it is considered that usually a plurality of transistors are introduced by diffusion in one carrier crystal, it will easily be seen that carrier crystals with an area of 2× 2 mm. are not sufficient in order to accommodate the resistances necessary for these transistors. It would of course be possible to increase the area of the carrier crystals, but this would lead to a considerable increase in the number of rejects during production. Apart from this, it is naturally very uneconomical if the major part of the area of the carrier crystal is required for diffused resistances, while the transistors, i.e. the actual amplifying elements, occupy only a small fraction of the area. A more favorable area ratio could only be achieved with this first variant of the said one method by increasing the specific surface resistances, but with surface resistances substantially higher than 300 ohm per square, the properties of the transistors, of which the base electrodes are as mentioned above produced by diffusion simultaneously with the resistance path, are unfavorably influenced. In addition to the disadvantage of the relatively large area which is required, the "diffused resistances" produced according to the first variant of the said one method still have the disadvantage that their capacitance in relation to the carrier crystal is relatively high on account of their large area, and this in turn, for the reasons already mentioned above, leads to an increased current demand. For all these reasons, the first variant of the said one method is not considered for the production of a resistance per stage in the order of magnitude between some hundreds of kiloohms up to some megohms, such as necessary in accordance with the foregoing comments for collector currents of the controlled transistors in the order of magnitude of microamperes.

The second variant of the said one method, i.e., the construction of the resistances as pinch resistors, would certainly be suitable from the point of view of the specific surface resistance, since specific surface resistances up to 10 kiloohms per square, i.e. a resistance path with a width of 25 μ would have a resistance of 400 kiloohms over a length of 1 millimeter, but pinch resistors have quite a number of disadvantageous properties, which then have to be accepted if the second variant of the said one method is used for the production of the resistances. The main disadvantage of the pinch resistors is that considerable numbers of rejects occur during the manufacture thereof. This is easily explained, because the reduction of the passage cross section down to very small values always involves the danger of the said further diffusion at a position along the resistance path and producing this reduction in the passage cross section penetrates through the entire passage cross section and thus causes a break in the resistance path. In such a case, the entire integrated switching circuit has to be rejected, and when it is considered that there are five pinch resistors on one such integrated switching circuit, then already a rejection quota related to the individual pinch resistors of 10 percent (i.e. of 10 pinch resistors, one has a break) leads to half of the manufactured integrated switching circuits having to be rejected and to the manufacturing costs of the integrated switching circuits being doubled. Other important disadvantages of the pinch resistors are that their resistance values (likewise caused by variations in the diffusion limit of the said further diffusion) vary in the ratio of about 4:1 or with a tolerance of ± 60 percent of the nominal value, and that the resistance values of the separate pinch resistors in addition also show a relatively large dependence on voltage and in addition a pronounced dependence on temperature. When using pinch resistors, therefore, it is necessary to expect very large deviations in the resistance value from the nominal value, and this leads firstly to difficulties in connection with the dimensions of the circuit arrangement and secondly the current required by the circuit arrangement can consequently be considerably higher than the nominal current demand which is produced when the nominal resistances are maintained, and this can act very disadvantageously on the desired low energy consumption. For all these reasons, the use of the second variant of the said one method for the production of one resistance per stage of the integrated switching circuits is in every case combined with considerable disadvantages both from the point of manufacture and of functioning, and therefore is not recommended.

As regards the surface requirement for resistances in the range from a few hundred kiloohms up to some megohms, the said other method has the same disadvantages as the first variant of the said first method, because the specific surface resistance which can be produced with the said vapor-coating procedure forming this other method likewise has a maximum at about 300 ohms per square and the maximum width of the resistance paths which can be achieved and which are left after the said path-etching operations taking place following the vapor-coating likewise amounts to about 25 μ. It is true that resistances with a substantially higher specific surface resistivity can also be obtained when using the vapor-coating method in individual production, but these resistances are not capable of being reproduced, i.e. when other resistances are produced with exactly the same processing steps, the specific surface resistivity of the separately produced resistances does not remain constant, but fluctuates from one to the other by factors as compared with an assumed mean value. This is because, for producing specific surface resistivities with values substantially above 300 ohms per square, the vapor-coating must be kept so low that there is no longer formed a closed vapor-coated layer, but rather a latticelike vapor-coated layer. With the vaporizing of a surface, there are initially formed, as it were, singular points on which the material to be applied condenses, and these points are then connected with the further vapor treatment by material bridges, so that a latticelike layer of vapor-coated material is formed, and it is only in the course of the further vaporizing that also the interstices between the individual meshes of this lattice are filled with material. Specific surface resistances which are capable of being reproduced are only obtained from the stage where also these interstices are filled or as soon as the vapor-coating layer has become a closed layer, and the maximum specific surface resistances which can be achieved with such a closed vapor-coated layer are, as already stated, 300 or at most 400 or 500 ohms per square. As compared with the diffused resistances produced by the first variant of the said first method, these resistances produced by means of the vapor-coating method do however have the advantage that in the first place they are almost independent of temperature, whereas the diffused resistances show a temperature dependence which is in fact still substantially lower than that of the pinch resistors, but is higher by about one order of magnitude than the relatively slight temperature dependence of the resistances produced by the vapor-coating method, and another decisive advantage of the resistances produced by the vapor-coated method, by comparison with the diffused resistances, is that the parasitic capacitors of the resistances produced by the vapor-coating method with respect to the carrier crystal are insignificantly small as compared with the corresponding parasitic capacitors of the diffused resistances. On the other hand, the disadvantage of the resistances produced by the vapor-coating method as compared with the diffused resistances is that, for the production of the first-mentioned resistances, two additional processing steps have to be carried out after completing the formation of the transistors and diodes on the carrier crystal, namely, the vapor-coating of a resistance layer and the etching away of a part of the vapor-coated layer are necessary, whereas the manufacture of the diffused resistances is effected simultaneously with the formation of the transistors and diodes on the carrier crystal. However, since the resistances produced by the vapor-coating method, as already mentioned, show substantially smaller parasitic capacities with respect to the carrier crystal than the diffused resistances and, for the reasons already explained in greater detail above, high parasitic capacities bring with them a substantial increase in the current consumption, if the resistances to be manufactured should not shown any too great manufacturing tolerances and thus the choice which remains is only between the first variant of the said first method (diffused resistances)

and the other method (resistances produced by the vapor-coating method), then it is necessary to accept the disadvantage of the two additional steps connected with the vapor-coating method in order to be able at all to produce the required low current consumption.

Despite the relatively large surface requirement (up to 95 percent of the total area of the carrier crystal) and the necessity of two additional processing steps associated with the vapor-coating method, the only one of the said three possibilities (first and second variants of one method and also the other method) which remains for the manufacture of the resistances necessary with working currents in the order of magnitude of microamperes and with resistance values in the range from a few hundred kiloohms up to some megohms is the vapor-coating method, if working currents per stage in the range of microamperes are to be achieved and the tolerances or the dispersions of the resistance values are not to be too great.

It is clear that this unsatisfactory situation has already led to experiments in many different directions for the purpose of avoiding these highly resistive resistances if at all possible.

Some of these experiments are directed to using two transistors of complementary conduction type per stage instead of one transistor with a collector resistance and to control the signal inputs of the two complementary transistors with the same signal, usually by connecting the base electrodes of the two complementary transistors to one another and to the connected collectors of the two complementary transistors of the preceding stage. This procedure has become known as the so-called bipolar complementary technique. In practice, this technique can only be employed if the two complementary transistors of each separate stage have the same or at least practically the same properties, and this in turn cannot be achieved with the formation of all transistors on the same carrier crystal, the so-called lateral technique. Actually, of all transistors produced on the same carrier crystal by the lateral technique, only the transistors of one conduction type have properties which seem to make these suitable as controllable or amplifying elements, while the transistors of the other conduction type show substantially lower amplification factors and also in other respects very different and generally less satisfactory properties than the transistors of the first-mentioned conduction type. Consequently, it is necessary to change over to another manufacturing technique, the so-called island technique, in order to be able to produce the complementary transistors which are necessary in practice for using the complementary technique and which show the same properties. With this island technique, initially potlike holes are etched in a mother crystal and then the entire surface of the mother crystal, including the potlike holes, is provided with an insulating oxide layer, and then the separate potlike holes are filled with carrier crystal material and thereafter the the back of the mother crystal is ground away until the bottoms of the potlike holes have disappeared and there now exists a mother crystal with a large number of carrier crystal islands insulated outwardly by an oxide layer, and then transistors of different conduction type with approximately the same properties can be formed on these carrier crystal islands, it being necessary for only one or more transistors of the same conduction type to be arranged on each island. The formation of the transistors on the separate carrier crystal islands is then carried out approximately in the same manner as with a single-carrier crystal. Therefore, with the island technique, several additional processing steps are again necessary for producing the integrated switching circuits and in addition the surface consumption when using the island technique is substantially higher, this being because the carrier crystal islands must be spaced at a relatively large distance from one another, so that no mutual influences occur when producing transistors of different conduction type on the different islands, and because in addition the area of the carrier crystal islands must for adjustment reasons be somewhat larger than the area required for the transistors to be formed on these islands. On the whole, for these reasons, the area of an integrated switching circuit produced by the island technique and having an integrated circuit by the complementary technique is not substantially smaller than the area of an integrated switching circuit produced by the lateral technique and with an integrated circuit which corresponds to the same conditions and in which the separate stages each comprise a transistor and a collector resistance produced by the vapor-coating method. Consequently, because of the necessity of producing the transistors by the island technique, the bipolar complementary technique does not provide any advantages as compared with the solution using one transistor per stage in the lateral technique and vapor-coated resistances, but on the contrary the additional processing steps up to the production of the mother crystal with the carrier crystal islands when using the island technique is technically substantially more complicated than the additional steps of vapor-coating and etching away, which are used when producing the vapor-coated resistances.

Other experiments were directed to providing two field effect transistors complementary to one another, instead of one transistor with a collector resistance. This technique is known under the name of the complementary MOS technique and these two similar difficulties as regards the arrangement of transistors complementary to one another on the same crystal as when using the bipolar complementary technique with the result that the space and area required when using the complementary MOS technique is just as great as that with the bipolar complementary technique. As a consequence, the complementary MOS technique does not produce the desired advantages, and on the contrary the manufacturing processes for the field effect transistors used in the MOS technique are more complicated than with the bipolar technique and in addition the field effect transistors require operating voltages of at least three to four volts, so that circuits using the MOS technique cannot be operated with a single cell.

Yet other experiments were directed to using two field effect transistors per stage instead of one transistor with a collector resistance, one of said two transistors being connected as a passive dipole and as it were taken the place of the collector resistance. This technique is likewise known within the range of the MOS technique. In this case, all field effect transistors can be of the same channel type, and under these circumstances, it is also possible to produce a substantially smaller space and area consumption than with bipolar integrated circuits each having one transistor and one vapor-coated resistance per stage. To this extent, therefore, the MOS technique with field effect transistors of the same channel type, which are partly connected as passive dipoles, initially provides an advantage, which however is again cancelled out by the fact that the working voltage for circuits in the MOS technique has to be at least 3 to 4 volts and as a consequence at least two if not three single cells are necessary for the current supply, so that the volume saved in the integrated switching circuits is on the other hand counteracted by a substantially larger volume requirement for the current supply source. The increased volume required is then also substantially greater than the volume which is saved when a battery with two or three series-connected cells is used instead of two or three separate monocells. Apart from the fact that altogether still no advantage is produced, the MOS technique, as already mentioned, is more complicated than the bipolar technique as regards the expense for manufacturing the transistors, so that therefore the last-mentioned experiments have also not provided any improvement.

The only procedure which has provided one step forward as regards a reduction in the number of the resistances is the technical switching procedure which has already been assumed in connection with the present electronic circuit and which has already been mentioned in connection with the type of electronic circuits initially referred to and to which the invention relates, this procedure being the galvanic or direct coupling of the base-emitter circuits of the controlled transistors respectively to the collector of the controlled transistor of the preceding stage and in this way to save at least the very highly resistive resistances for the conduction of the base current.

The object of the invention was to avoid the highly resistive collector resistances in connection with such an electronic circuit of the type initially referred to, but without as a result having to accept any other disadvantages which again cancel out the advantage of avoiding these collector resistances.

According to the invention, this is achieved in connection with an electronic circuit of the type initially referred to by the fact that the collectors of at least some of the controlled transistors and also the base-emitter circuits of at least part of the controlled transistors are connected to constant current sources which supply the mean collector currents of the controlled transistors respectively connected to their collectors and also the mean currents of the connected load resistances and/or the mean base currents of the controlled transistors respectively connected to their base-emitter circuits, and that the constant current sources contain, as elements keeping the current constant, transistors which are of the conduction type complementary to the conduction type of the controlled transistors and on the base-emitter paths of which there stands a reference voltage keeping at least approximately constant the current in their collector-emitter circuit and of which the current flowing in their collector-emitter circuit determines the current supplied by the constant current source, and that the reference voltages standing on the elements for keeping the current constant and respectively for several or all of such elements included in the same integrated switching circuit are supplied from a common reference source, and that each reference source produces a temperature-dependent reference voltage at the connected elements which keep the current constant, the alteration of such voltage with the temperature being in the same direction as the alteration of the current-maintaining elements connected to the reference voltage inputs and for temperature-independent collector currents of the same voltage to be applied with the temperature.

This solution makes it possible for the controlled transistors and those transistors of the conduction type complementary to the conduction type of the controlled transistors and contained in the constant current sources to be included in the same integrated switching circuit and for the integrated switching circuits to be produced by the lateral technique, because the condition which exists for the transistors contained in the constant current sources is not the same as with the bipolar complementary technique and is not that they must have the same properties as the controlled transistors. Without any disadvantageous effects on the efficiency of the electronic circuit, the transistors contained in the constant current sources can in fact have properties which differ substantially from those of the controlled transistors and can in principle be substantially inferior to those of the controlled transistors. Consequently, the conditions which are set by the present electronic circuit for the properties of the transistors of one or other conduction type contained in the integrated switching circuits conform exactly to the results which are supplied by the lateral technique as regards the properties of transistors of different conduction type and included in the same integrated switching circuit. Since, as already previously mentioned, the surface required by transistors in integrated switching circuits is substantially smaller than the surface required by highly resistive resistances and the manufacturing costs for an integrated switching circuit are substantially independent of the number of the transistors included in said circuit, because all transistors are introduced by diffusion simultaneously in the same manufacturing step into the integrated switching circuit, it is possible by replacing highly resistive collector resistances by constant current sources having transistors as elements keeping the current constant and complementary to the controlled transistors, to achieve the result, without any disadvantages, that up to 70 percent of the total surface of the integrated switching circuit are available for the controlled transistors and diodes and that furthermore it is possible to avoid additional processing steps, as with the resistances produced by the vapor-coating method, and disadvantageous properties of resistances, as with the diffused resistances and the pinch resistors.

With the present electronic circuit, it is possible with advantage to provide as reference source a temperature-dependent resistance charged with an at least approximately constant reference current, of which relative changes with the temperature correspond at least approximately to the relative changes of the input resistances at the reference voltage inputs of the connected current maintaining elements with the temperature, such input resistances being divided by the current amplification factors of the corresponding current-maintaining elements. The temperature-dependent resistances can in this case advantageously be formed by semiconductor elements incorporated into the integrated circuits.

In the case where only one common reference source is provided for all those elements of the circuit arrangement which keep the current constant and only one temperature-dependent resistance, the reference current can preferably be supplied to the latter by way of a constant ohmic resistance from the current supply source of the circuit arrangement. This constant ohmic resistance can with particular advantage be a discrete resistance, which is arranged between the current supply source of the circuit arrangement and the integrated switching circuits. By this means, it is possible to achieve the result that only semiconductor elements and no ohmic resistances at all are incorporated into the integrated switching circuits.

In the case where several reference sources are provided for each one group of elements for keeping the current constant, the temperature-dependent resistances constituting the reference sources can with advantage each be connected to another constant current source, which supplies the reference current for the connected temperature-dependent resistance, these additional constant current sources being in principle constructed in the same manner as the constant current sources supplying the collector-base currents and be connected to another common reference source, which is formed by another temperature-dependent resistance charged with at least an approximately constant base current. In the same way as with a circuit arrangement having only one common reference source, the constant base current can then be supplied through a constant ohmic and preferably discrete resistance from the current supply source of the circuit arrangement, so that therefore, even with several reference sources, the result can be obtained that only semiconductor elements and no ohmic resistances at all are to be included in the integrated switching circuits. The case where several reference sources are provided is particularly to be considered with circuit arrangements having several integrated circuits, because the reference sources of the temperature-dependent resistances constituting such sources should preferably be included in the same integrated switching circuit as the current-maintaining elements connected to them and accordingly, with several integrated switching circuits, an at least equal number of reference sources is provided.

With the present electronic circuit arrangement, the constant current sources can each contain a transistor as elements for keeping the current constant, the base-emitter path of said transistor being connected to the reference source, while its collector forms the output of the constant current source. However, if the current amplification of those transistors which are complementary to the controlled transistors and which form the elements for keeping the current constant is relatively low, because of producing the integrated switching circuits by the lateral technique, and consequently relatively high base currents have to be supplied to the transistors in order to produce the required output currents of the constant current sources, it is possible for each constant current source to be provided with two transistors instead of just one transistor, it being possible for the second transistor either to be a transistor which is complementary to the first and of which the base-emitter path is connected into the connection between the collector of the first transistor and the output of the constant current source and which amplifies the collector current of the first transistor, or it is possible to use a transistor of the same conduction type as the first transistor, of which the base-emitter path is connected into the base supply line to the first transistor and which amplifies the current supplied by the reference source or reduces the loading of the reference source.

With the present electronic circuit arrangement, and in the case where the constant current sources each contain a transistor as the element keeping the current constant and optionally each contain a second transistor connected with its base-emitter path into the collector line of the first, the temperature-dependent resistances constituting a reference source, can advantageously be each formed by a transistor connected as a dipole, of which the base and collector electrodes are connected, or also by a diode connected in the transmission direction or by transistors forming the parallel connection of the input resistances of these base-emitter paths of the current-maintaining elements which are connected parallel to one another, and in the case where the constant current sources each contain two transistors with base-emitter paths connected in series, are advantageously each formed by two transistors, of which the base-emitter paths are likewise connected in series and of which the emitter-electrode disposed at one end of this series connection forms one of the poles and the base electrode disposal at the other end of this series connection, together with the collector electrode of the transistor forming, with its emitter, one end of the series connection, forms the other pole of the temperature-dependent resistance, or also are formed by two diodes connected in series in the passing direction or by transistors forming the parallel connection of the input resistances at those series connections which are connected parallel to one another of the base-emitter paths of the elements keeping the current constant.

Embodiments of the invention are given by way of example and hereinafter explained by reference to the following figures, wherein.

Figure 4:
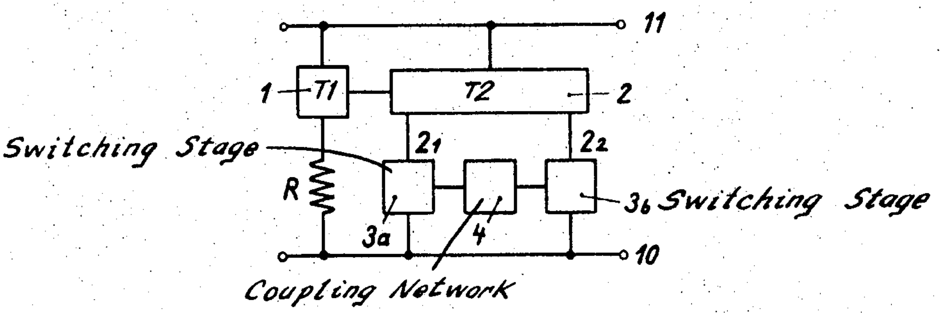
FIG. 4 is a block diagram of a first constructional example of an electronic circuit arrangement according to the invention, in which the controlled transistors form the controllable switching elements of a bistable multivibrator.
Figure 8:
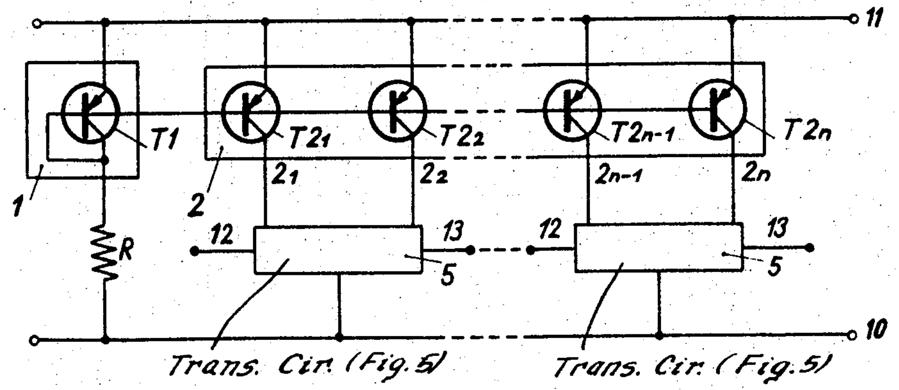
Figures 6A, 6B:
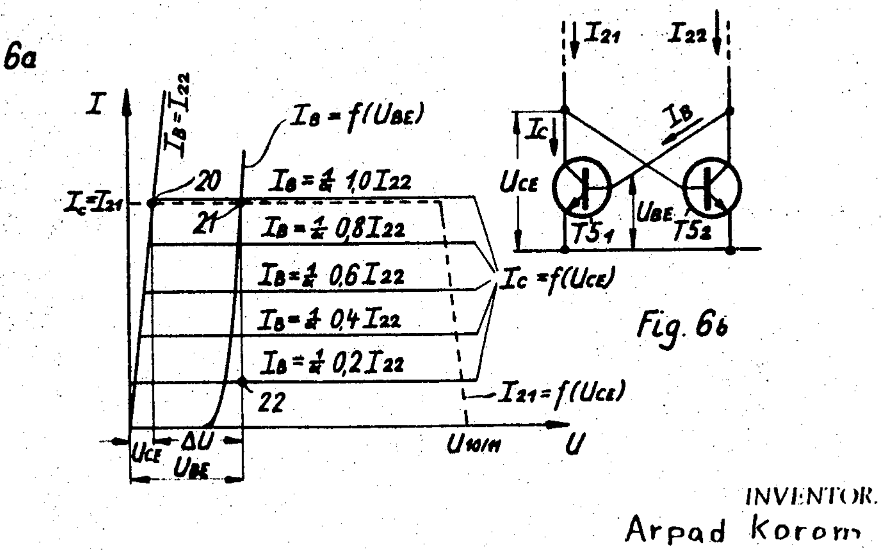
Figure 5:
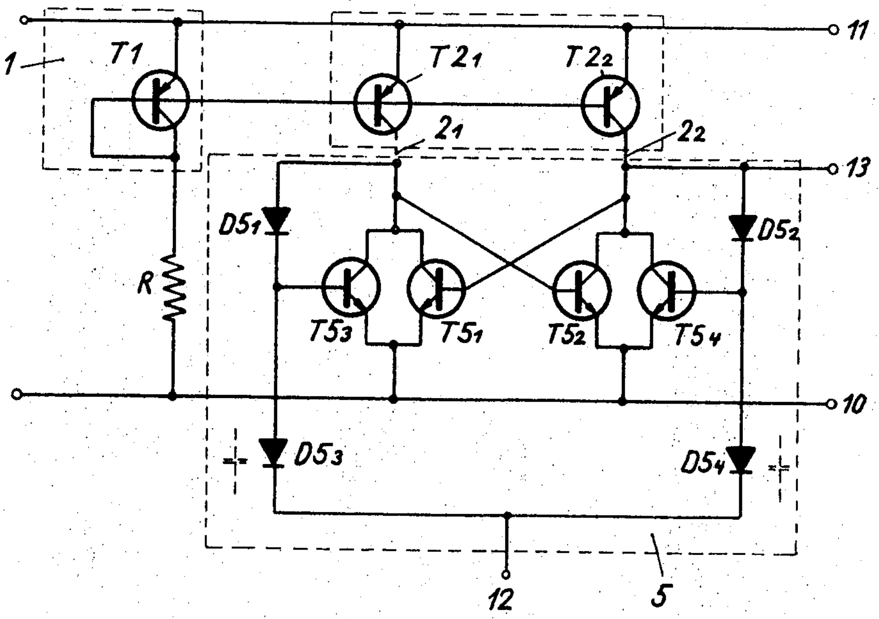
Figure 7:
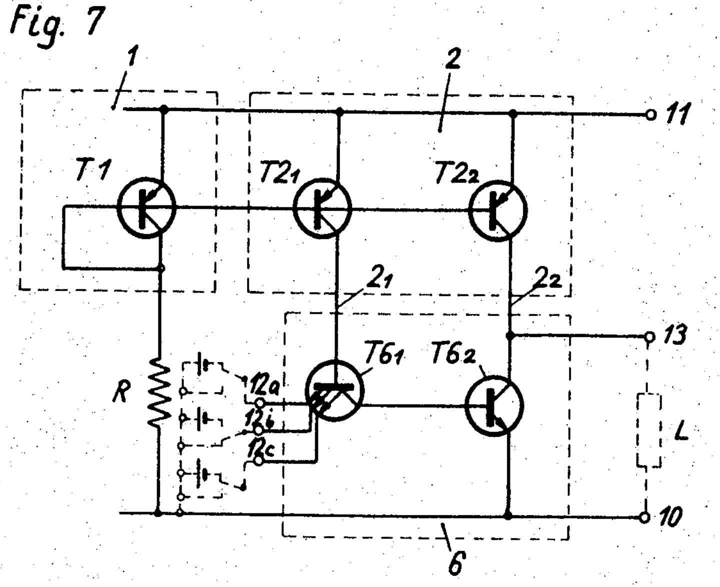
Figure 9:
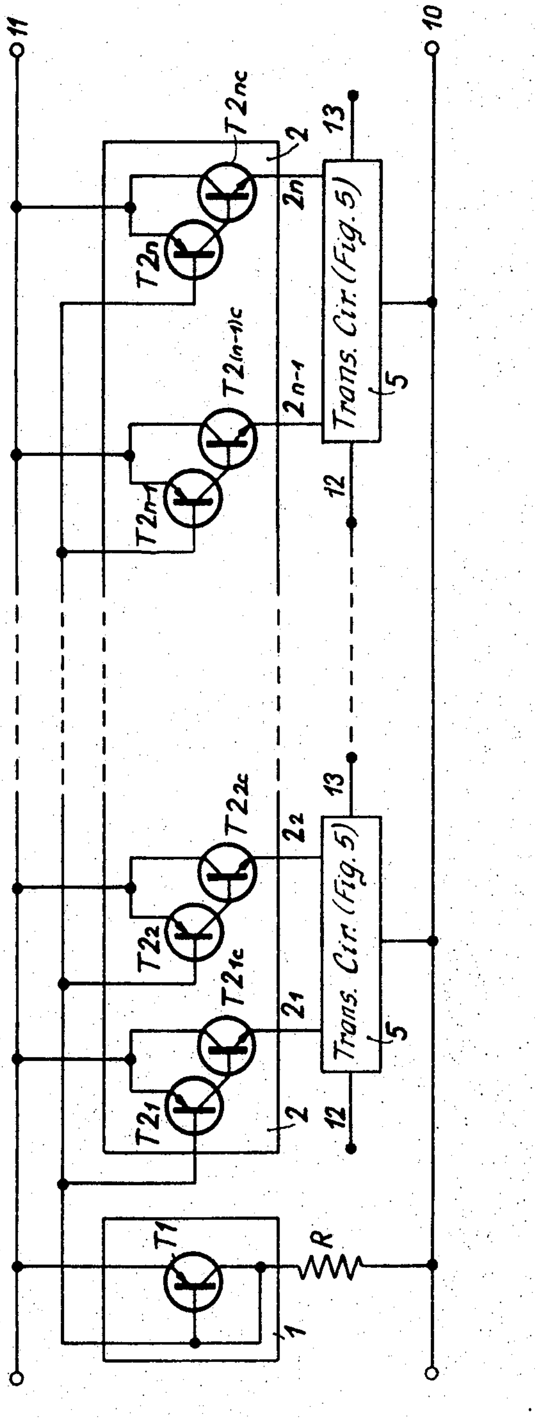
Figure 10:
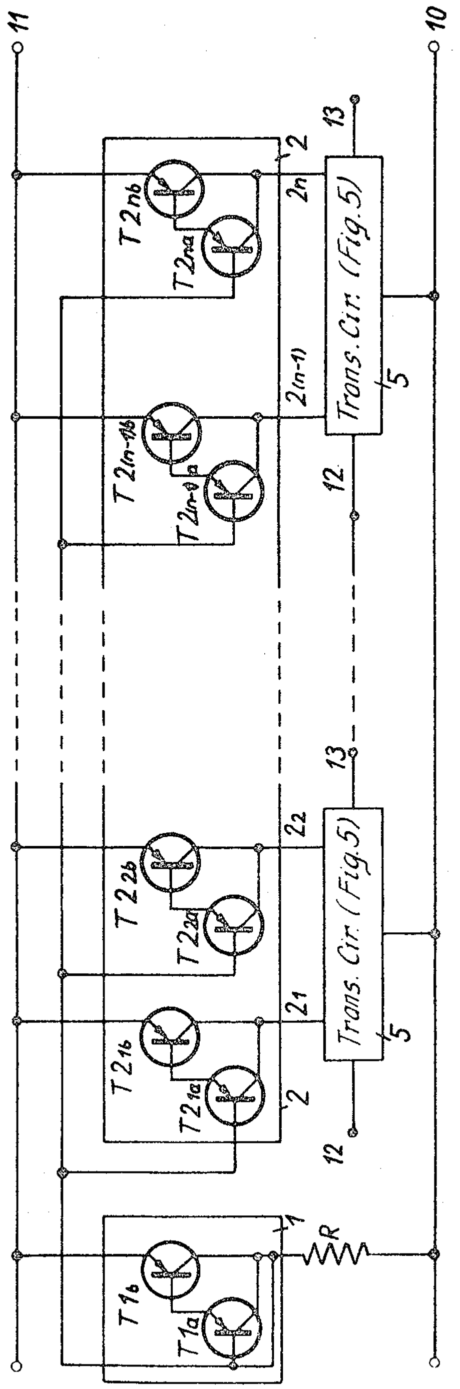
Figure 11:
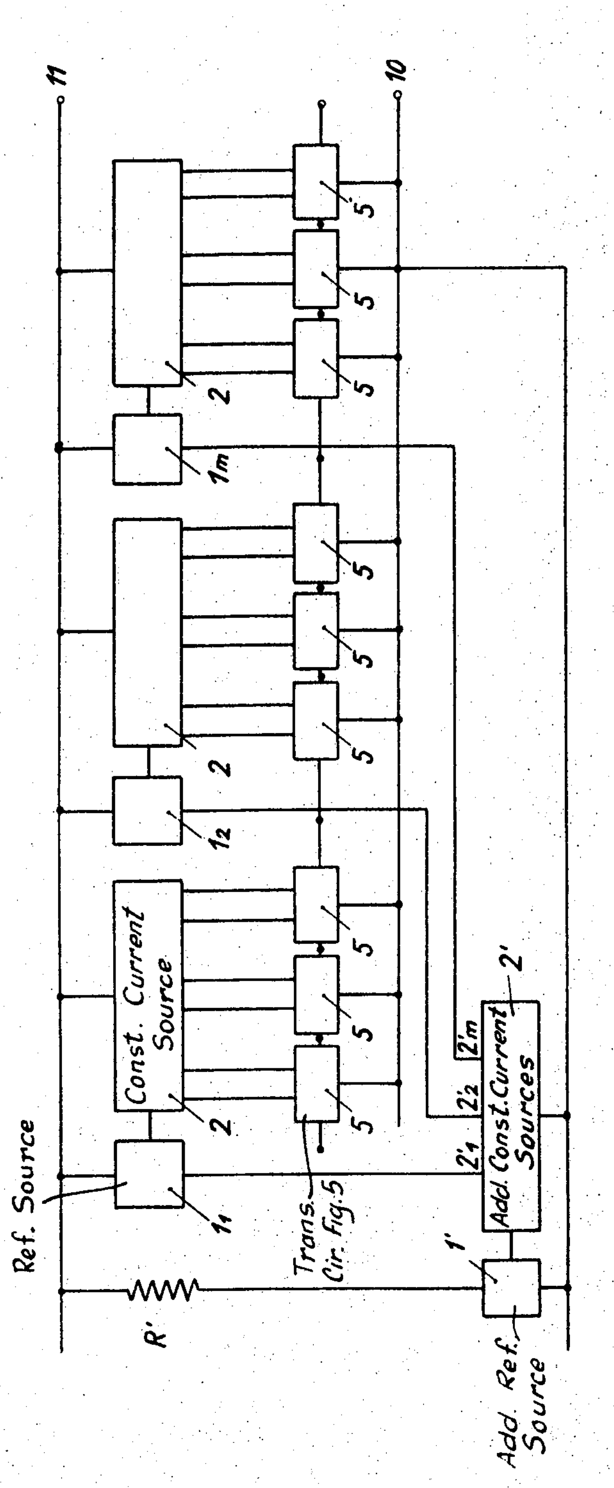

FIG. 5 is an embodiment of an electronic circuit arrangement according to the invention which corresponds to the constructional example of FIG. 4 and in which the internal construction of the blocks is shown in FIG. 4, the blocks 3*a*, 3*b* and 4 being assembled into a single block 5;

FIG. 6*a* and *b* represent the connection of two controlled transistors, as in the constructional example of FIG. 5, to form a bistable unit (FIG. 6*b*) and the working diagram of these transistors (FIG. 6*a*);

FIG. 7 is a second embodiment of an electronic circuit arrangement according to the invention, in which the controlled transistors form the controllable switching elements of a NAND gate;

FIG. 8 is another embodiment of an electronic circuit arrangement according to the invention with a plurality of bistable multivibrators assembled to form a pulse frequency reducer or a counter chain, the blocks 5 being for example constructed like the block 5 in FIG. 5;

FIG. 9 is a constructional example of an electronic circuit arrangement according to the invention, which is similar to the embodiment of FIG. 8 and in which the individual constant current sources each contain two transistors;

FIG. 10 is a constructional example of an electronic circuit according to the invention, which is likewise similar to the embodiment of FIG. 8 and in which both the separate constant current sources and the reference source each contain two transistors;

FIG. 11 is a block diagram of another constructional example of an electronic circuit according to the invention, comprising a plurality of bistable multivibrators (blocks 5) assembled into a counter chain, the constant current sources being subdivided into several groups (blocks 2) and a reference source (blocks 1) being provided for each group, and in which the reference currents for the separate reference sources are supplied from a group of additional constant current sources (block 2′), which are connected to another common reference source (block 1′).

Figure 1:
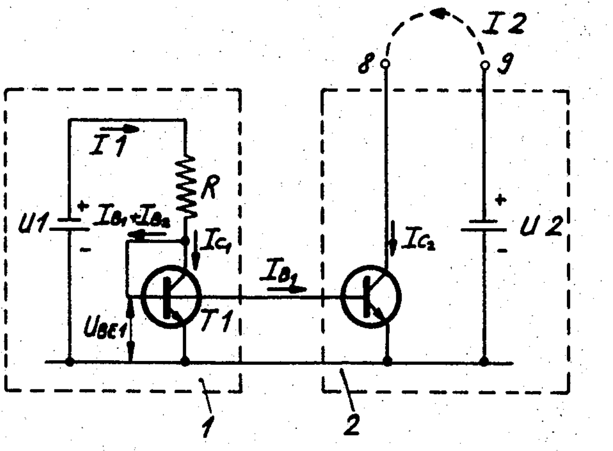
Fig. 1 Prior Art
FIG. 1 shows the constructional principle of a constant current source which can be used for the present electronic circuit arrangement.

The construction in principle of a constant current source which can be used for the present electronic circuit arrangement is shown in FIG. 1. The voltage source U1 supplies through the resistance R a current I1, which is approximately constant, when the voltage U1 is substantially larger than the voltage $U_{BE1}$ through the base-emitter path of the transistor T1. The voltage $U_{BE1}$ flowing through the base-emitter path of the transistor T1 is so adjusted that the collector current $I_{C1}$ of the transistor T1 is just equal to that current I1 delivered by the voltage ($U1-U_{BE1}$) through the resistance R, less the base currents $I_{B1}$ and $I_{B2}$ of the transistors T1 and T2.

At the transistor T2, the base-emitter path of which is connected parallel to the base-emitter path of the transistor T1, there is the same base-emitter voltage $U_{BE1}$ as at the transistor T1. If now the transistor T2 and the transistor T1 are identical, then accordingly, since the base-emitter voltages of the two transistors T1 and T2 are the same, the collector currents of the two transistors $I_{C1}$ and $I_{C2}$ must also be the same. If the two transistors T1 and T2 are included in the same integrated switching circuit and if they both have equal emitter surfaces, then the condition as regards their identity can be considered as given. This identity is also provided if the ambient conditions of the integrated switching circuit are changed, because these alterations affect both transistors T1 and T2 to the same degree and produce equal variations with both transistors T1 and T2.

If now it is firstly assumed that the base currents $I_{B1}$ and $I_{B2}$ are comparatively small as compared with the collector current $I_{C1}$, then the collector current $I_{C1}$ is equal to the current I1 and is thus practically constant when the voltage $U_{BE1}$ is substantially smaller than the battery voltage U1. With identity of the two transistors T1 and T2, the current $I_{C2}$ must accordingly also be constant, and this completely independently of the strength of the battery voltage U2, provided that this is not so low that the collector voltage of the transistor T2 falls to values below approximately 0.1 to 0.2 volt. Consequently, it is possible to derive from the two connections 8 and 9 of the constant current source shown in FIG. 1, a current I2 which, independently of all external conditions, is in practice completely constant, if the following preliminary conditions are provided; firstly, identity of the two transistors T1 and T2, which can be achieved by including both transistors in the same integrated switching circuit; secondly, negligibility of the base currents $I_{B1}$ and $I_{B2}$ as compared with the collector current $I_{C1}$, which can be achieved by sufficiently high current amplifications of the transistors T1 and T2; thirdly, negligibility of the base-emitter voltage $U_{B1}$ as compared with the battery voltage U1, which can be achieved by choosing a suitably high battery voltage U1; and fourthly, a collector voltage at the transistor T2 above approximately 0.1 to 0.2 volt, which can be achieved by a sufficiently high battery voltage U2.

The last-mentioned conditions are, however, not compulsory for producing a constant or at least substantially constant current I2, but can still be facilitated as follows:

The presumption of the identity of the transistors T1 and T2 has been made, so that equal collector currents $I_{C1}$ and $I_{C2}$ are produced with equal voltage through the base-emitter paths of the two transistors. However, it is already sufficient for a constant current I2 if the ratio between $I_{C2}$ and $I_{C1}$ remains at least approximately constant. This is however already the case when both transistors are included in the same integrated switching circuit, but have emitter surface of different sizes. The currents $I_{C1}$ and $I_{C2}$ then behave relatively to one another like the emitter surfaces of the transistors T1 and T2, the ratio $I_{C2}$:$I_{C1}$ being practically independent of the voltage $U_{BE1}$ applying on the base-emitter paths of the two transistors. Furthermore, the condition that both transistors T1 and T2 are included in the same integrated switching circuit also does not have to be absolutely satisfied. In actual fact, the two transistors T1 and T2 can also be incorporated into different integrated switching circuits, if these latter have been produced in the same production series and are so arranged in the electronic circuit arrangement that their ambient conditions can be considered as practically the same. Finally, the condition relating to the identity of the two transistors T1 and T2 can be reduced to the relative alterations of the resistance of the passive dipole, of which one pole forms the emitter electrode and of which the other pole forms the assembled base and collector electrodes of the transistor T1, corresponding with changes in the ambient conditions at least approximately to the relative changes of the resistance of the base-emitter path of the transistor T2 divided by the current amplification factor of the transistor T2, with changes in the ambient conditions, that is to say, primarily with changes in temperature. This can also be expressed somewhat more specifically by saying that the resistances of the base-emitter paths of the two transistors T1 and T2 must be in a ratio to one another which is independent of the ambient conditions, that is to say, primarily of the temperature, and furthermore also the current amplification factors of the two transistors T1 and T2 must be in a ratio to one another which is independent of the ambient conditions. Finally, it is also to be noted that these conditions are naturally only to be satisfied, at least approximately, within the actually required working range or within the possible fluctuation range of the temperature.

The condition that the base currents $I_{B1}$ and $I_{B2}$ are to be negligible as compared with the collector current $I_{C1}$ has been made because the base currents are changed with the ambient conditions, e.g. the temperature, when the collector currents remain constant independently of the outer ambient conditions. The base currents $I_{B1}$ and $I_{B2}$ consequently consists of a constant portion and a changing portion, and it is completely adequate for an almost constant current T2 if the changing portions of the base currents are substantially smaller than the collector current $I_{C1}$. By way of example, if a working range from 0° to 40° C. is provided and the base currents are changed in this range by about 20 percent of their current value at 0° C., the base currents $I_{B1}$ and $I_{B2}$ together could readily amount to, for example 40 percent of the collector current, since their current change within the working range then indeed amounts to only 8 percent of the collector current $I_{C1}$ and accordingly also the current I2 with $I_{C2}$ would only change by 8 percent.

Furthermore, the condition that the base-emitter voltage $U_{BE1}$ is to negligible as compared with the battery voltage U1 was made, because the base-emitter voltage $U_{BE1}$ is changed with the ambient conditions, e.g. the temperature, when the collector current $I_{C1}$ remains constant, independently of the ambient conditions. Like the base currents $I_{B1}$ and $I_{B2}$, the base-emitter voltage $U_{BE1}$ also consists of a constant portion and a changing portion and it is quite sufficient for an almost constant current I2 if the changing portion of the base-emitter voltage is substantially smaller than the battery voltage U1, because only the latter causes a change in the current I1 through the resistance R and thus a change of the collector currents $I_{C1}$ and $I_{C2}$ or of the currents $I_2$ delivered by the constant current source. The strength of the changing portion of the base-emitter voltage $U_{BE1}$ is once again determined by the working range or the possible fluctuation range of the temperature.

It is only the last-mentioned condition, that in fact the collector voltage on the transistor T2 should be above approximately 0.1 to 0.2 volt, which should be satisfied in every case. The satisfying of this condition does not however cause any difficulties, for a battery voltage U2 which is sufficiently high for this purpose can easily be obtained by both the transistor T1 and the transistor T2, as shown in FIG. 2, being connected to the same voltage source 10/11.

Figure 2:
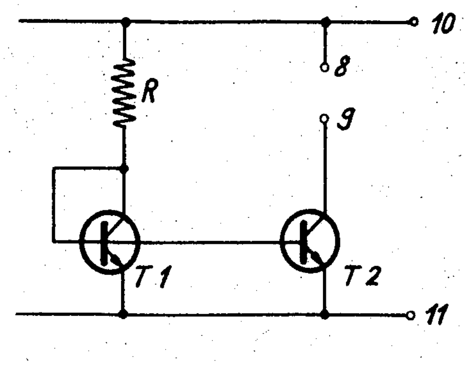
Fig. 2 Prior Art
FIG. 2 shows the construction of a constant current source as in FIG. 1, with only one current supply source.

Constant current sources, as in FIG. 2, are known per se and are also already employed in the integrated circuit art. If now such a constant current source as in FIG. 2 were to be used in place of a collector resistance, it would not be possible to save any resistances, since in fact each of these constant current sources likewise contains a resistance R and the value of this latter will have to be in the same order of magnitude as the collector resistance, in the place of which the constant current source is effective. It would on the contrary produce the disadvantage that, apart from the current which is supplied by the constant current source or by the transistor T2, there would also still be required a current of approximately the same height as flowing through the transistor T1, so that therefore the current requirements of the complete circuit arrangement would be increased to about double, quite apart from the fact that in addition no resistances can be saved and also two transistors are still required for each constant current source. The replacement of each of the collector resistances by a constant current source, as in FIG. 2, would therefore not be appropriate.

Figure 3:
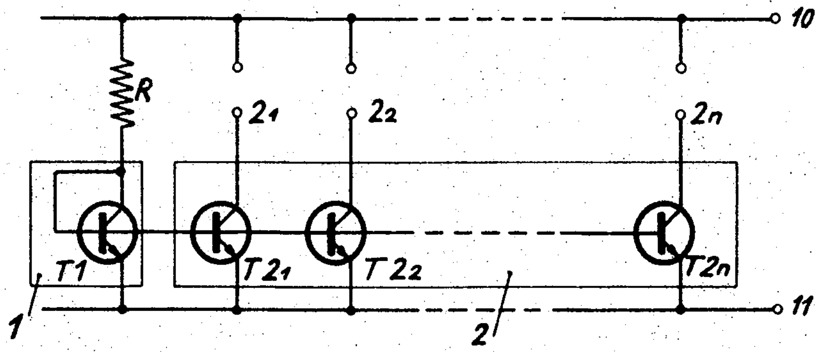
FIG. 3 shows a combination of *n* constant current sources which correspond in principle to the constant current source of FIG. 1 and which each have a transistor as element for keeping the current constant and a reference source which is common to all current-maintaining elements.

It is only possible to produce an advantage, not by using a constant current source, as in FIG. 2, in place of each collector resistance, but by using several constant current sources assembled into a group instead of one group of several collector resistances, in which sources the base-emitter voltages of the elements T2 maintaining constancy of current are supplied by a voltage divider consisting of a resistance R and a reference transistor T1 and common for all elements T2 of the group. Such a circuit arrangement having several constant current sources $2_1$ to $2_n$, assembled into a group, in which the base-emitter voltages, hereinafter referred to as reference voltages, of the elements $T2_1$ to $T2_n$ keeping the current constant are supplied by a common reference source consisting of the reference transistor T1 and the constant ohmic resistance R, is shown in FIG. 3. The advantage which is produced with such a circuit arrangement as in FIG. 3 is greater as the number *n* of the constant current sources assembled into a group is greater, since each constant current source takes the place of a collector resistance and thus *n* collector resistances are replaced by a single resistance R associated with the reference source. The transistor $T2\mu$ additionally required per constant current source as an element keeping the current constant does not, as already mentioned, constitute in the integrated circuit art any appreciable increase in the manufacturing cost for the integrated circuits, and the surface which this transistor T2 requires is substantially smaller than the surface which would be required by the collector resistance replaced by the constant current source 2 . In the case of *n* constant current sources assembled into a group and having a common reference source, the increase in the current consumption of the circuit arrangement by the reference current flowing through the resistance R and the reference transistor T1 is not considerable, since this increase in current only makes up the *n*th part of the total current consumption of the circuit arrangement, and thus, at least with a relatively large number *n*, is still below the current tolerances which are to be expected when using collector resistances, because of the tolerances of the resistance values thereof.

By using such a circuit as shown in FIG. 3, constant current sources can be used instead of all collector resistances and possible also in place of any existing base resistances of an electronic circuit arrangement, so that therefore the entire electronic circuit arrangement can be composed of semiconductor elements and the only ohmic resistance of the circuit, namely, the resistance R supplying the reference current, can be arranged as a discrete resistance between the current supply source and the integrated switching circuits.

FIG. 4 shows the block diagram of an electronic circuit according to the invention, with a resistance R through which the reference current is supplied, a reference source 1, which can for example contain a reference transistor T1, as in FIG. 3, a group assembled into a block 2 and consisting of two elements T2 which keep the current constant and of which the collectors form the outputs $2_1$ and $2_2$ of two constant current sources, and a bistable multivibrator with a first switching stage *3a*, a second switching stage *3b* and a coupling network 4 between the two switching stages *3a* and *3b*.

FIG. 5 illustrates in detail such an electronic circuit arrangement as in FIG. 4, but the blocks *3a*, *3b* and 4 are assembled to form a single block 5. The operation of the bistable multivibrator which is shown in FIG. 5 is as follows: the two constant current sources $2_1$ and $2_2$ respectively supply a constant current to the connected switching elements, and in fact the constant current source $2_1$ supplies to collector currents of the transistors $T5_1$ and $T5_3$ and the base currents of the transistors $T5_2$ and $T5_3$, and the constant current source $2_2$ supplies the collector currents of the transistors $T5_2$ and $T5_4$ and the base currents of the transistors $T5_1$ and $T5_4$. The currents supplied by the constant current sources $2_1$ and $2_2$ remain constant, independently of the switching state of the bistable multivibrator, that is to say, if for example that switching stage of the multivibrator which comprises the transistors $T5_2$ and $T5_4$ is in the state " 1" with high voltage through the collector-emitter paths of the transistors $T5_2$ and $T5_4$ and low collector current of these two transistors, almost all of the current supplied by the constant current source $2_2$ is flowing into the base of the transistor $T5_1$. The current flowing through the diode $D5_2$ into the base of the transistor $T5_4$ is smaller by the current amplification factor of the transistor $T5_4$ than the collector current of the transistor $T5_4$ and is consequently negligible if, as assumed, the collector currents of the transistors $T5_2$ and $T5_4$ are already small as compared with the current applied by the constant current source $2_2$. Since now the base of the transistor $T5_1$ is supplied with approximately all of the currents supplied by the constant current source $2_2$, the collector current of the transistor $T5_1$, under linear conditions, would have to be larger by approximately the current amplification factor $\alpha$ of the transistor $T5_1$ than the current $I2_2$ supplied by the constant current source $2_2$. However, this is not possible, because the constant current source $2_1$ only supplies a current $T2_1$ of the same value as the constant current source $2_2$. As a consequence, as regards the transistor $T5_1$, the operating point 20 (FIG. *6a*) still lying on the ascending branch of its output characteristic line $I_C=f(U_{CE})$ applicable for the parameter $I_b=I2_2$ is adjusted, with which $I_C=I2_1$, and on this operating point 20, the collector voltage $U_{CE}$ of the transistor $T5_1$ and thus also the base-emitter voltage of the transistor $T5_2$ are so small that the base current of the transistor $T5_2$, as will be apparent from the characteristic line $I_Bf(U_{BE})$ in FIG. *6a*, is practically zero and thus also, as initially assumed, the collector current of the transistor $T5_2$ is practically zero or very small as compared with the current $T2_2$ supplied by the constant current source $2_2$. As can be seen from the characteristic line field in FIG. *6a*, the operating point 20 is however also adjusted when the base current $I_B$ of the transistor $T5_1$ is substantially smaller than the current $I2_2$ supplied by the constant current source $2_2$. In practice, the base current $I_B$ of the transistor $T5_1$, as shown in FIG. *6a*, can fall to $I_B=1/\alpha \cdot I2_2$, without changing the operating point 20. It is only with base currents $I_B<1/\alpha T2_2$ that an operating point with relatively high collector voltage of the transistor $T5_1$ would occur, for example, at $I_B=1\cdot 0.2\cdot I2_2$ of the operating point 22 (the transistor $T5_2$ then simultaneously being changed into the operating point 20). This is important, in that the diode $D5_2$ switched in the pass direction through which is flowing the relatively high base-emitter voltage $U_{BE}$ of the transistor $T5_1$ less the base-emitter voltage of the transistor $T5_4$, could still pass a current at high temperatures, which current, after amplification by the transistor $T5_4$, could still derive a considerable part of the current supplied by the constant current source T2 through the transistor $T5_4$, so that the base current $I_B$ supplied to the transistor $T5_1$ would be correspondingly reduced. It is to be observed in this connection that the voltage through the diode $D5_2$ with a current of 1 $\mu$a. supplied by the constant current source $2_2$ is about 50 m.v. when the collector current of the transistor $T5_4$ is above 100 n.a., and that accordingly, with a current amplification of the transistor $T5_4$ by 50, the resistance formed by the diode $D5_2$ must be larger than 50 m.v.: 100 n.a./50=50 m.v.:2 n.a.=25 MΩ, when the collector current of the transistor $T5_4$ is to remain below 100 n.a., and with such transit resistances, already coming into the range of size of the barrier resistances, the relative changes in resistance of the diodes with the temperature are fairly large. However, if the collector current of the transistor $T5_4$ rises because of a change in resistance of the diode $D5_2$, then initially the base current and with the latter also the base-emitter voltage of the transistor $T5_1$ falls, and thereby once again the voltage through the diode $D5_2$ is reduced until the change in resistance is balanced out. However, this is only possible when such a reduction of the base current $I_B$ of the transistor $T5_1$ has no influence on the operating point 20 of the transistor $T5_1$ down to very small values of $I_B$, and for this reason the possibility of a reduction of the base current $I_B$ down to $1/\alpha \cdot I2_2$ without altering the operation point 20 is of great importance. The replacement of the collector resistances by constant current sources only leads to a complete success if simultaneously semiconductor elements can also be incorporated into the circuit arrangement instead of all other high-ohmic resistances, that is to say, in the present case, the diodes $D5_1$ and $D5_2$ in place of base resistances for the transistors $T5_3$ and $T5_4$, because it is only then, i.e. after omitting the high-ohmic resistances requiring relatively large surfaces, a best possible utilization of the integrated switching circuits with semiconductor elements requiring relatively small surfaces is produced. The effect mentioned above, that the operating point of the transistor $T5_1$ (and simultaneously with the latter, also the operating point of the transistor $T5_2$) is changed as soon as the base current of the transistor $T5_1$ falls below $I2_2/\alpha$, is now used for triggering the multivibrator. For this purpose, a pulse is applied to the advancing input 12/10, and this, through the diodes $D5_3$ and $D5_4$ switched in the blocking direction and acting as capacitances, simultaneously raises the voltage on the two base electrodes of the transistors $T5_3$ and $T5_4$. Since now the voltage on the base of that of the two transistors $T5_3$ and $T5_4$ of which the collector-emitter path is connected parallel to the collector-emitter path of the transistor $T5_1$ or $T5_2$ which is in the operating point 20, is still somewhat lower than the collector voltage $U_{CE}$ in the operating point 20, while on the contrary the voltage on the base of the other of the two transistors $T5_3$ and $T5_4$ is only slightly below the base-emitter voltage $U_{BE}$ of the transistor $T5_1$ or $T5_2$ which is in the operating point 20 and thus lies somewhat above the collector voltage $U_{CE}$ in the operating point 20, the advancing pulse first of all switches through this other of the two transistors, e.g. the transistor $T5_4$, and the increase in collector current of this transistor $T5_4$ has the effect that a constantly increasing portion of the current supplied by the constant current source $2_2$ is directed through the transistor $T5_4$ until the base current $I_B$ of the transistor $T5_1$ falls below $I2_2/\alpha$, and at this moment the multivibrator triggers, i.e. the collector voltage of the transistor $T5_1$ and thus the base-emitter voltage on the transistor $T5_2$ increases, until the transistor $T5_2$ has changed into the operating point 20 and the collector of the transistor $T5_1$ has applied thereto the same voltage which beforehand was applied through its base-emitter path. The voltage stroke of the multivibrator or the change in voltage of the collector voltage of the transistor $T5_1$ with the triggering of the multivibrator is therefore $\Delta U=U_{BE}-U_{CE}$ (FIG. 6). The signal output 13/10 of the bistable multivibrator 5 is in the usual way through a switching stage or through the collector-emitter paths of the transistors $T5_2$ and $T5_4$ belonging to this switching stage.

FIG. 7 shows another embodiment of an electronic circuit arrangement according to the invention, in which the controlled transistors $T6_1$ and $T6_2$ form the controllable switching elements of a NAND gate. The NAND gate likewise once again comprises a resistance R supplying the reference current, a reference source 1 with the reference transistor T1 and a group of two transistors $T2_1$ and $T2_2$ which form elements keeping the current constant and assembled in a block 2, the collectors of said transistors each forming the outputs $2_1$ and $2_2$ of a constant current source. The controlled transistors of the NAND gate, namely, the multiemitter transistor $T6_1$ and the transistor $T6_2$ are assembled in the block 6. In order to facilitate understanding of the operation of the NAND gate which is shown in FIG. 7, there are also shown in broken lines and in diagrammatic form on the inputs 12*a*/10, 12*b*/10 and 12*c*/1. of the NAND gate those control sources which are connected to these inputs, while the load resistance L lying across the output is indicated in broken lines on the output 13/10. The operation of the NAND gate as shown in FIG. 7 is as follows: when all inputs 12*a*, 12*b* and 12*c* of the NAND gate are positively biased with respect to the zero conductor 10 (all switches of the control sources shown in broken lines up), then the emitter currents of the multiemitter transistor $T6_1$ are zero, because the collector potential of the transistor $T6_1$ is lower than the potentials of its three emitters. Consequently, the current $I2_1$ supplied by the constant current source $2_1$ flows to the base of the transistor $T6_2$ through that base-collector path of the transistor $T6_1$ which is switched in the pass direction with this potential distribution. By this current $I2_1$ supplied to the base-emitter path of the transistor $T6_2$, the transistor $T6_2$ is switched through, so that practically all of the current $I2_2$ supplied by the constant current source $2_2$ discharges through the collector-emitter path of the transistor $T6_2$ and thus the voltage on the load resistance L falls to about 0.1 V. The current necessary for this purpose and to be supplied to the base of the transistor $T6_2$ is only $I2_2/\alpha_2/2$ with a safety factor 2, when $\alpha_2$ indicates the current amplification of the transistor $T6_2$. Since now the current supplied to the base of the transistor $T6_2$ is equal to $I2_1$, the current $I2_1$ supplied by the constant current source $2_1$ can be lower by the factor $\alpha_2/2$ than the current supplied by the constant current source $2_2$. Consequently, it is advisable in this case to make use of the possibility set forth above of making the current $I2_1$ supplied by the constant current source $2_1$ smaller in the required ratio than the current $I2_2$ supplied by the constant current source $2_2$ by the emitter surfaces of the transistors $T2_1$ and $T2_2$ being given different dimensions. With a required safety factor 2, the emitter surface $F_1$ of the transistor $T2_1$ must accordingly be such as $1:\alpha_2/2$ in relation to the emitter surface $F_2$ of the transistor $T2_2$.

It is to be noted in this connection that the positive biasing of the emitter of the transistor $T6_1$ (when the transistors $T6_1$ and $T6_2$ are silicon transistors, as is usual in the integrated circuit art) should amount to at least about 0.6 v., so that it is ensured that the entire current $I2_1$ is supplied through the base-collector path of the transistor $T6_1$ to the base of the transistor $T6_2$ and does not partly discharge through the base-emitter paths of the transistor $T6_1$. The positive biasing of the emitter of the transistor $T6_1$ should preferably be higher than 0.8 v., because then the voltage drop caused by the current $I2_1$ at the series connection of the base-collector path of the transistor $T6_1$ and of the base-emitter path of the transistor $T6_2$ is with certainty lower than the biasing of the emitter of the transistor $T6_1$ and thus the base-emitter paths of the transistor $T6_1$ are switched into the blocking direction. Furthermore, the operating voltage of the circuit between the points 10 and 11 should amount to at least about 1 v., so that the collector-emitter voltage of the transistor $T2_1$, which is in fact equal to the operating voltage between the points 10 and 11, less the said voltage drop caused by the current $I2_1$ at the transistors $T6_1$ and $T6_2$, cannot fall below 0.2 v. For what reasons the collector-emitter voltage of the transistors forming the elements keeping the current constant should not fall below 0.2 v. has in fact already been more fully explained in association with the foregoing general remarks concerning the constant current sources used with the present circuit arrangements. In addition, it should also be pointed out that with a group of transistors forming elements keeping the current constant and having base-emitter paths connected in parallel, also the other transistors and the currents supplied by these latter are likewise influenced if the collector-emitter voltage at one of these transistors falls below about 0.1 to 0.2 v. and the operating point of this transistor is thereby shifted into the ascending branch of the $I_C$—$U_{CE}$ characteristic line.

If now one or more of the inputs 12*a*, 12*b* and 12*c* are connected to the potential of the zero conductor 10 (one or more switches of the control sources shown in broken lines being down), then initially an emitter current flows in the first moment through the emitters connected to these inputs, the sum of the emitter currents being equal to the base current of the transistor $T6_1$, multiplied by the current amplification factor of the transistor $T6_1$. These emitter currents occurring in the first moment are collected by the collector of the transistor $T6_1$ and supplied to the base of the transistor $T6_2$. However, since this collector current of the transistor $T6_1$ does not flow in the pass direction, but in the blocking direction, through the base-emitter path of the transistor $T6_2$, the transistor $T6_2$ is blocked by this initially occurring collector current of the transistor $T6_1$ and this collector current only flows until the charging of the base of the transistor $T6_2$ has leaked away. Thereafter, the collector current of the transistor $T6_1$ becomes practically zero, the current $I2_1$ supplied to the base of the transistor $T6_1$ discharges in equal portions through those emitters of the transistor $T6_1$ which are connected to the zero conductor and the current $I2_2$ supplied by the constant current source $2_2$, since the transistor $T6_2$ is blocked, flows completely through the load resistance *L* and produced at this latter the output voltage $I_2 \cdot L$.

FIGS. 8 to 11 show several different constructional examples of electronic circuit arrangements according to the invention, with in each case a larger number of bistable multivibrators assembled to form a pulse frequency reducer or a counter chain, the blocks 5 corresponding in each case to the block 5 in FIG. 5. The circuit arrangements shown in detail in FIGS. 8 to 11 differ as regards the structure of the constant current sources.

As regards the circuit arrangement which is shown in FIG. 8, the constant current sources, as will be seen by comparison with FIG. 3, are constructed in the same manner as in the circuit arrangement shown in FIG. 3, i.e. each constant current source contains an element $T2_1$ to $T2_n$ for keeping the current constant, and *n* current constancy elements are assembled to form a group and obtain their reference voltages from a common reference source 1.

This circuit arrangement, which is of extreme advantage because of its simple structure and its cost, which is reduced to a minimum, is capable of being used in every case where the current amplification of the transistors $T2_1$ to $T2_n$ forming the elements keeping the current constant is substantially larger than the number *n* of the constant current elements assembled to form a group. In accordance with the above explanations, it can also be used when in fact the number *n* is not substantially larger than the current amplification of the transistors $T2_1$ to $T2_n$, but the alteration of the sum of all base currents of the transistors $T2_1$ to $T2_n$ being produced within the working range or the possible fluctuation range of the temperature is still small as compared with the collector current of the reference transistor T1.

However, it has already been explained in the introduction that, with the production of integrated switching circuits with complementary transistors in the lateral technique, the transistors of one of the two conduction types, namely, those which are used as elements keeping the current constant in the present electronic circuit arrangement, present very different properties, and in many cases, more especially as regards the current amplification, also poorer properties than the transistors of the other conduction type. In such cases, the easier condition that the said alteration in the sum of the base currents is to be small by comparison with the collector current of the reference transistor cannot be satisfied under all circumstances.

For these cases, the circuit arrangements shown in FIGS. 9 and 10 are provided. With these two circuit arrangements, the ratio between the currents delivered by the separate constant current sources and the currents to be supplied to the separate constant current sources by the reference source is increased by one additional transistor per constant current source or the current to be derived from the reference source per constant current source is correspondingly reduced.

With the circuit arrangement as shown in FIG. 9, the collector current of one of the transistors $T2_1$ to $T2_n$ forming an element which keeps the current constant is in each case supplied to the base of a transistor $T2_{1c}$ to $T2_{nc}$ of the same conduction type as that of the controlled transistors and amplified by the said following transistor $T2_{1c}$ to $T2_{nc}$. The emitters of the following transistors $T2_{1c}$ to $T2_{nc}$ then form the outputs $\mathbf{2}_1$ to $\mathbf{2}_n$ of the constant current sources. This circuit arrangement has the advantage that the current amplification of the following transistors $T2_{1c}$ to $T2_{nc}$ is in every case fairly large, since these transistors, in contrast to the transistors $T2_1$ to $T2_n$ forming elements keeping the current constant are of the same conduction type as the controlled transistors and consequently have equally good properties to those of the controlled transistors. On the other hand, it is a disadvantage that the current amplifications of these following transistors $T2_{1c}$ to $T2_{nc}$ can change with the temperature and these variations in current amplification cannot be compensated for. In addition, the voltage lying across the collector-emitter paths of the transistors $T2_{1c}$ to $T2_{nc}$ must be at least approximately 0.3 to 0.4 v., while by comparison therewith, the voltages through the collector-emitter paths of the transistors $T2_1$ to $T2_n$, with the circuit arrangement shown in FIG. 8, must only amount to 0.1 to 0.2 v.; in other words, with the circuit arrangement in FIG. 8, about 0.2 v. more voltage is available for the controlled transistors than with the circuit arrangement in FIG. 9. For these reasons, the circuit arrangement in FIG. 9 is only to be considered when the current amplification of the transistors $T2_1$ to $T2_n$ is so low that also the square of this current amplification is still relatively small. It is to be observed in connection with the circuit arrangement of FIG. 9 that the reference current supplied to the reference source 1 through the resistance R should be at approximately the same level as the currents supplied by the separate constant current sources $\mathbf{2}_1$ to $\mathbf{2}_n$, and not perhaps only at the same level as the collector currents of the transistors $T2_1$ to $T2_n$.

However, if the square of the current amplification of the transistors forming elements keeping the current constant already has a considerable value, then it is more expedient to use a circuit such as shown in FIG. 10. In this case, both of the transistors $T2_{1a}$ and $T2_{1b}$, or $T2_{2a}$ and $T2_{2b}$, etc. associated with the separate constant current sources, form elements which keep the current constant and are connected in series with their base-emitter paths. The transistors $T2_{1a}$ to $T2_{na}$ and $T2_{1b}$ to $T2_{nb}$ must in this case be of a conduction type similar to one another and complementary to the conduction type of the controlled transistors and have the same poor properties in comparison with the controlled transistors. As a consequence, the circuit arrangement of FIG. 10 can only be used with advantage when the current amplification of the transistors $T2_{1a}$ to $T2_{na}$ and $T2_{1b}$ to $T2_{nb}$ is not so small that even the square of the current amplification of the individual transistors or the total current amplification resulting from the series connection of the base-emitter paths of two such transistors is still too low. However, if this total current amplification is sufficiently large, then the circuit arrangement in FIG. 10 is substantially more advantageous than the circuit arrangement in FIG. 9, because the currents supplied by the constant current sources $\mathbf{2}_1$ to $\mathbf{2}_n$ do not depend on changes due to temperature in the current amplification of the transistors $T2_{1a}$ to $T2_{na}$ and $T2_{1b}$ to $T2_{nb}$, for with the circuit arrangement in FIG. 10, these changes due to temperature in the current amplification are compensated for. Moreover, the relatively high minimum voltage of 0.3 to 0.4 v. on the collector-emitter paths of the transistors $T2_{1b}$ to $T2_{nb}$, which is likewise necessary with the form as illustrated of the circuit arrangement in FIG. 10, can in principle be avoided by a circuit design as shown in FIG. 10, by the collectors of the transistors $T1_a$ and $T2_{1a}$ to $T2_{na}$ not being connected to the collectors of the respectively associated transistors $T1_b$ and $T2_{1b}$ to $T2_{nb}$, but with the zero line or conductor 10. Nevertheless, the collector currents of the transistors $T1_a$ and $T2_{1a}$ to $T2_{na}$ must then be accepted as loss currents or as additional current demand of the circuit arrangement. As regards the arrangement shown in FIG. 10, the reference source 1 should be constructed in the same manner as the separate constant current sources, i.e. it should, like these latter, comprise two transistors $T1_a$ and $T1_b$ connected in series with their base-emitter paths, so that the characteristics of reducing reference source and of the separate constant current sources, and of the reference transistors and current-constancy elements contained in these latter, are as far as possible the same.

As well as the possibility illustrated by the circuits in FIGS. 9 and 10 of overcoming the difficulties which are mentioned above and which possibly arise with a circuit arrangement as in FIG. 8, which is to increase the ratio between the currents supplied by the separate constant current sources and the currents to be supplied from the reference source to the separate constant current sources, the possibility also exists of counteracting these difficulties by reducing the number $n$ of the constant current sources which are assembled into a group and which are connected to a common reference source. In this case, therefore, with a prescribed number of totally required constant current sources, this prescribed number of constant current sources is to be split up into several groups of constant current sources and a separate reference source is to be associated with each of the separate groups. This possibility is more especially to be considered when the electronic circuit arrangement comprises a plurality of integrated switching circuits, because the reference source and the reference transistor or transistors associated with the reference source should in fact, as already explained above, preferably be always included in the same integrated switching circuit as the constant current sources connected to them. In order now that such a subdivision of the constant current sources into separate smaller groups, with each of which is associated a separate reference source, does not involve a corresponding increase in the number of resistances R serving to supply the reference currents to the separate reference sources, it is advantageous to supply each of the separate reference sources with the reference currents from another constant current source and to associate an additional common reference source with these additional constant current sources.

FIG. 11 shows such a circuit arrangement, in which the constant current sources are subdivided into groups, with each of which is associated a separate reference source $\mathbf{1}_1$ to $\mathbf{1}_m$, the reference currents of the separate reference sources $\mathbf{1}_1$ to $\mathbf{1}_m$ each being supplied from an additional constant current source $\mathbf{2}_1'$ to $\mathbf{2}_m'$ and these further constant current sources $\mathbf{2}_1'$ to $\mathbf{2}_m'$ are connected to a common additional reference source 1', to which a constant base current is supplied through the resistance R'. It is obvious that the separate groups of constant current sources assembled into the blocks 2 and 2' can be constructed in one of the forms which are described herein, even if it seems most expedient with the circuit arrangement in FIG. 11 to construct at least the block 2' according to the block in FIG. 8. The reference sources 1 and 1' are then to be suitably adapted to the blocks 2 and 2', respectively. In this connection, it is also to be mentioned that the reference transistors T1 in FIGS. 3, 8 and 9 can in certain circumstances also be replaced by a diode connected in the pass direction and the two reference transistors in FIG. 10 can be replaced by two series-connected diodes connnected in the pass direction.

Furthermore, as regards the bistable multivibrators 5 which are included in FIGS. 8 to 11 and which are connected together to form a pulse frequency reducer or a counter chain, it is also to be mentioned that the switching frequency of the separate reducer stages or counter stages is in fact reduced from stage to stage by the factor 2. Accordingly, the upper working frequency of the bistable multivibrators 5 decreases along the reducer or counter chain from multivibrator to multivibrator. It has already been mentioned at the start that the minimum necessary working current increases on account of the parasitic capacitances with the above working frequency. Conversely, it is now possible here for the working current supplied to be reduced from the reducer stage to reducer stage or from counter stage to counter stage, and in fact from stage to stage up to a maximum of 50 percent of the working current in the preceding stage. As a consequence, for an *n*-stage reducer or an *n*-stage counter chain, it is possible altogether to produce a reduction in the current demand to a minimum of two *n*ths of the current demand with the working current remaining the same along the reducer or the counter chain. With the present electronic circuit arrangement, such a reduction of the working current can, as already mentioned, be produced by the emitter surfaces of the elements which keep the current constant and which are included in the constant current sources provided for the separate bistable multivibrators being decreased from reducer stage to reducer stage, or from counter stage to counter stage, in accordance with the required working current reduction, advantageously by about 30 to 60 percent of the emitter surfaces of the constant current elements associated with the preceding stage.

In conclusion, it is also to be pointed out hat the present invention can not only be used for digital electronics circuit arrangements, as in the constructional examples which have been described, but also to linear electronic circuit arrangements. This is already apparent from the simple consideration that a bistable multivibrator is basically nothing but an amplifier with negative feedback. However, also the consideration that the constant current sources with a linear amplifier, in the same way as with the digital circuit arrangements shown in FIGS. 5 and 7, always supply the mean currents of the connected electrodes to the controlled transistors and the deviations of the actual currents supplied to these electrodes from the said mean currents are to be considered as modulations which are caused by the control signals on the control inputs of the controlled transistors, leads to the same object. The use of the invention in connection with linear electronic circuit arrangements accordingly provides, at least in the integrated switching art, the same advantages as with digital circuit arrangements.

I claim:

1. Electronic circuit arrangement comprising at least one integrated circuit and having a plurality of controlled transistors of equal conduction type, the collector currents of which being alterable by control signals in their base-emitter circuits and to the collectors of which load resistance being coupled galvanically, said load resistances being formed each by at least one of the group comprising the base-emitter circuits of the controlled transistors and other load resistances, characterized in that the collectors of at least a part of the controlled transistors and the base-emitter circuits of at least a part of the controlled transistors are connected to constant current sources which deliver the mean collector currents of controlled transistors respectively connected to the constant current sources by their collectors and the mean base currents of controlled transistors respectively connected to the constant current sources by their base-emitter circuits and the mean currents of other load resistances respectively connected to the constant current sources, the constant current sources comprise, as constant current-maintaining elements, transistors being of a conduction type complementary to the conduction type of the controlled transistors and being provided on their base-emitter paths with reference voltages influencing the currents flowing in their collector-emitter circuits, said currents flowing in said collector-emitter circuits determining the currents delivered by the constant current sources, said reference voltages being delivered, respectively for a plural number of the constant current-maintaining elements incorporated within the same integrated circuit, from an appertaining common reference source, said reference voltages being temperature-dependent and the alteration of which with temperature changes running in the same sense as an alteration of the reference voltage with temperature changes effecting temperature-independent collector currents of the transistors forming constant current-maintaining elements.

2. Electronic circuit arrangement according to claim 1 wherein the reference source is formed by a two-pole which has a temperature-dependent resistance and which is charged with an at least approximately constant reference current, said temperature-dependent resistance having relative changes in dependence on temperature which correspond at least approximately to relative changes in dependence on temperature of such resistances resulting from input resistances at reference voltage inputs of the constant current-maintaining elements by division by the respective current amplification factor of said constant current-maintaining elements.

3. Electronic circuit arrangement according to claim 1 characterized in that all constant current-maintaining elements of the whole circuit arrangement are provided with reference voltage from one common reference source.

4. Electronic circuit arrangement according to claim 3 comprising only one integrated circuit, wherein said common reference source is formed by a two-pole which has a temperature-dependent resistance and which is charged with an at least approximately constant reference current, said two-pole being formed by at least one semiconductor element incorporated within the integrated circuit.

5. Electronic circuit arrangement according to claim 3 wherein said common reference source is formed by a two-pole which has a temperature-dependent resistance and which is charged with an at least approximately constant reference current, the arrangement comprising a constant ohmic resistor for supplying said two-pole with said reference current from a DC source.

6. Electronic circuit arrangement according to claim 5 wherein the resistance of said constant ohmic resistor is firstly greater than the resistance of said two-pole at 20° C. and is secondly greater than five times the change in resistance of said two-pole within the temperature range from 0° C. to 40° C.

7. Electronic circuit arrangement according to claim 5 wherein said constant ohmic resistor is a discrete resistor not incorporated in the integrated circuit and arranged between said DC source and the integrated circuit.

8. Electronic circuit arrangement according to claim 5 wherein said constant ohmic resistor is a discrete resistor not incorporated in the integrated circuit and arranged between said DC source and the integrated circuit and wherein only semiconductor elements, but on ohmic resistor, are incorporated within the integrated circuit.

9. Electronic circuit arrangement according to claim 1 comprising a plurality of reference sources, each of which belonging to a group of the constant current-maintaining elements.

10. Electronic circuit arrangement according to claim 9 comprising a plurality of integrated circuits, each of which comprising one group of the constant current-maintaining elements and the belonging one of the reference sources, each reference source being formed by a two-pole which has a temperature-dependent resistance and which is charged with an at least approximately constant reference current, said two-pole being formed by at least one semiconductor element incorporated within the respective integrated circuit and being connected to a common DC source of the circuit arrangement via a constant ohmic resistor, each said group of the constant current-maintaining elements comprising all constant current-maintaining elements of the respective integrated circuit.

11. Electronic circuit arrangement according to claim 10 wherein each said constant ohmic resistor is incorporated within the same integrated circuit as the two-pole connected over the resistor to the DC source.

12. Electronic circuit arrangement according to claim 9 wherein each reference source is formed by a two-pole which has a temperature-dependent resistance and which is charged with an at least approximately constant reference current, each said two-pole being connected to an appertaining further constant current source which delivers the reference current for the connected two-pole, said further constant current sources comprise, as constant current-maintaining elements, transistors being of the same conduction type as the conduction type of the controlled transistors and being provided on their base-emitter paths with reference voltages influencing the currents flowing in their collector-emitter circuits, which currents determine the reference currents delivered by said further constant current sources, said reference voltages for the constant current-maintaining elements of these further constant current sources being delivered from a common further reference source, said further reference source being formed by a further two-pole, which has a temperature-dependent resistance and which is charged with an at least approximately constant basic current, the resistance of said further two-pole having relative changes in dependence on temperature which correspond at least approximately to relative changes in dependence on temperature of such resistances resulting from input resistance at reference voltage inputs of the constant current-maintaining elements connected to said further reference source by division by the respective current amplification factor of the respective constant current-maintaining elements.

13. Electronic circuit arrangement according to claim 12 wherein each group of constant current-maintaining elements comprises a plurality of said elements incorporated within the same integrated circuit and the two-pole forming the reference source belonging to the group is formed by at least one semiconductor element incorporated within the same integrated circuit as the constant current-maintaining elements of the group.

14. Electronic circuit arrangement according to claim 12 wherein said further two-pole is connected to a DC source via a constant ohmic resistor.

15. Electronic circuit arrangement according to claim 12 wherein said further two-pole is connected to a DC source via a constant ohmic resistor, the resistance of which being firstly greater than the resistance of said further two-pole at 20° C. and being secondly greater than five times the change in resistance of the said further two-pole within the temperature range from 0° C. to 40° C.

16. Electronic circuit arrangement according to claim 12 wherein said further two-pole is connected to a DC source via a constant ohmic resistor, which is a discrete resistor not incorporate in the integrated circuit and arranged between said DC source and the integrated circuit.

17. Electronic circuit arrangement according to claim 12 characterized in that only semiconductor elements, but no ohmic resistor, are incorporated within the integrated circuits.

18. Electronic circuit arrangement according to claim 1 wherein each of a number of the constant current sources comprises, as constant current-maintaining element, only one transistor, the base-emitter paths of the transistors forming constant current-maintaining elements and being connected to the same reference source are connected in parallel.

19. Electronic circuit arrangement according to claim 18 wherein the collectors of the transistors forming constant current-maintaining elements constitute the outputs of the constant current sources, to which outputs said collectors of at least a part of the controlled transistors and said base-emitter circuits of at least a part of the controlled transistors are connected.

20. Electronic circuit arrangement according to claim 18 wherein each reference source is formed by a two-pole, which has a temperature-dependent resistance and which is charged with an at least approximately constant reference current, at least one two-pole being formed by a transistor, the emitter electrode of which forms one pole of the two-pole and the collector-electrode of which and the base-electrode of which are connected together and form the other pole of the two-pole, said parallel-connected base-emitter paths of the transistors forming constant current-maintaining elements being connected in parallel to the two-pole, the transistor forming the two-pole being of the same conduction type and being incorporated within the same integrated circuit as said transistors forming constant current-maintaining elements and being, by their parallel-connected base-emitter paths, connected in parallel to the two-pole.

21. Electronic circuit arrangement according to claim 18 wherein each reference source is formed by a two-pole, which has a temperature-dependent resistance and which is charged with an at least approximately constant reference current, at least one two-pole being formed by a diode, said parallel-connected base-emitter paths of the transistors forming constant current-maintaining elements being connected in parallel to the diode, the diode being passed by said reference current and being incorporated within the same integrated circuit as said transistors forming constant current-maintaining elements and being, by their parallel-connected base-emitter paths, connected in parallel to the diode.

22. Electronic circuit arrangement according to claim 18 wherein each reference source is formed by a two-pole, which has a temperature-dependent resistance and which is charged with an at least approximately constant reference current, at least one two-pole being formed by said parallel-connected base-emitter paths of the transistors forming constant current-maintaining elements.

23. Electronic circuit arrangement according to claim 1 wherein each of a number of the constant current sources comprises, as constant current-maintaining elements, a pair of transistors, the base-emitter paths of each such pair of transistors being connected in series, the series connections of base-emitter paths of pairs of transistors, which are connected to the same reference source, are connected in parallel, and wherein the collectors of the transistors forming each with its emitter one terminal of one of the series connections constitute the outputs of the constant current sources, to which outputs said collectors of at least a part of the controlled transistors and said base-emitter circuits of at least a part of the controlled transistors are connected.

24. Electronic circuit arrangement according to claim 23 wherein at least a pair of transistors has the collectors of the pair of transistors connected together.

25. Electronic circuit arrangement according to claim 23 wherein each reference source is formed by a two-pole, which has a temperature-dependent resistance and which is charged with an at least approximately constant reference current, at least one two-pole being formed by a pair of transistors, the base-emitter paths of this pair of transistors being connected in series, the emitter electrode at one end of this series connection forms one pole of the two-pole, the base-electrode at the other end of this series connection and the collector electrode of the transistor forming with its emitter said one end of this series connection are connected together and form the other pole of the two-pole, said parallel-connected series connections of base-emitter paths of pairs of transistors forming constant current-maintaining elements being connected in parallel to the two-pole, the pair of transistors forming the two-pole being of the same conduction type and being incorporated within the same integrated circuit as said pairs of transistors forming constant current-maintaining elements and being, by said parallel-connected series connections of their base-emitter paths, connected in parallel to the two-pole.

26. Electronic circuit arrangement according to claim 25 wherein at least one pair of transistors forming the two-pole has the collectors of the pair of transistors connected together.

27. Electronic circuit arrangement according to claim 23 wherein each reference source is formed by a two-pole, which has a temperature-dependent resistance and which is charged with an at least approximately constant reference current, at least one two-pole being formed by a pair of diodes connected in series, said parallel-connected series connections of base-emitter paths of pairs of transistors forming constant current-maintaining elements being connected in parallel to the two-pole, the series connection of said pair of diodes being passed by said reference current and said pair of diodes being incorporated within the same integrated circuit as said pairs of transistors forming constant current-maintaining elements and being, by said parallel-connected series connections of their base-emitter paths, connected in parallel to the two-pole.

28. Electronic circuit arrangement according to claim 23 wherein each reference source is formed by a two-pole, which has a temperature-dependent resistance and which is charged with an at least approximately constant reference current, at least one two-pole being formed by said parallel-connected series connections of base-emitter paths of the pairs of transistors forming constant current-maintaining elements.

29. Electronic circuit arrangement according to claim 1 comprising at least one bistable multivibrator, the multivibrator comprising four said controlled transistors, two of which being associated with a first switching stage of the multivibrator and two of which being associated with a second switching stage of the multivibrator, the multivibrator being further provided with two said constant current sources, one of said two constant current sources having connected thereto the collectors of the two controlled transistors associated with said first switching stage and the base of one of the two transistors associated with said second switching stage and, via a diode connected in pass direction, the base of one of the two transistors associated with the first switching stage, the other one of said two constant current sources having connected thereto the collectors of the two transistors associated with the second switching stage and the base of the other of the two transistors associated with the first switching stage and, via a diode connected in pass direction, the base of the other of the two transistors associated with the second switching stage, the emitters of the four controlled transistors of the multivibrator being connected together, the multivibrator having an input and an output, the input being formed by two connection points, one of which being the connection point of the four emitters and the other one of which being connected, respectively via a diode connected in the barrier direction and acting as a capacitance, with the base of said one of the two transistors associated with the first switching stage and with the base of said other of the two transistors associated with the second switching stage, the output of the multivibrator being connected in parallel to the collector-emitter path of one of the four controlled transistors.

30. Electronic circuit arrangement according to claim 29 comprising a plurality of bistable multivibrators connected to form a chain of binary stages, wherein each of the multivibrators forms one of the binary stages and the stages are interconnected respectively by connecting the signal output of the multivibrator forming the first one of the two binary stages following one another with the signal input of the multivibrator forming the second one of said two binary stages following one another.

31. Electronic circuit arrangement according to claim 30 wherein the emitter surfaces of the transistors forming the constant current-maintaining elements of the constant current sources associated with the individual bistable multivibrators decrease in size from binary stage by 30 to 50 percent of the emitter surfaces in the respectively preceding binary stage.

32. Electronic circuit arrangement according to claim 1 comprising at least one NAND gate, the NAND gate comprising two said controlled transistors and being provided with two said constant current sources, one of said two controlled transistors being a multiemitter transistor and the other one being a normal three-electrode transistor, the base of the multiemitter transistor being connected to one of said two constant current sources and the collector of the multiemitter transistor being connected to the base of said normal transistor and the collector of said normal transistor being connected to the other of said two constant current sources, the inputs of the NAND gate being formed each by one of the emitters of the multiemitter transistor and the emitter of said normal transistor and the output of the NAND gate being connected in parallel to the collector-emitter path of said normal transistor.

* * * * *

UO-1050
(5/69)

UNITED STATES PATENT OFFICE
CERTIFICATE OF CORRECTION

Patent No. 3,617,778 Dated November 2, 1971

Inventor(s) ARPAD KOROM

It is certified that error appears in the above-identified patent and that said Letters Patent are hereby corrected as shown below:

Claim 8, line 5, "on" should be --- no --

Signed and sealed this 18th day of April 1972.

(SEAL)
Attest:

EDWARD M.FLETCHER,JR.
Attesting Officer

ROBERT GOTTSCHALK
Commissioner of Patents